US012571657B2

(12) United States Patent
Van Wegberg

(10) Patent No.: US 12,571,657 B2
(45) Date of Patent: Mar. 10, 2026

(54) SENSOR READOUT SYSTEM AND SENSOR READOUT METHOD

(71) Applicant: Stichting IMEC Nederland, Eindhoven (NL)

(72) Inventor: Roland Van Wegberg, Oss (NL)

(73) Assignee: Stichting IMEC Nederland, Eindhoven (NL)

( * ) Notice: Subject to any disclaimer, the term of this patent is extended or adjusted under 35 U.S.C. 154(b) by 141 days.

(21) Appl. No.: 18/531,008

(22) Filed: Dec. 6, 2023

(65) Prior Publication Data

US 2024/0192028 A1 Jun. 13, 2024

(30) Foreign Application Priority Data

Dec. 8, 2022 (EP) ..................................... 22212170

(51) Int. Cl.
*G01D 5/16* (2006.01)
*G01R 17/10* (2006.01)
(Continued)

(52) U.S. Cl.
CPC ............. *G01D 5/16* (2013.01); *G01R 17/105* (2013.01); *G01R 33/0029* (2013.01); *H03F 3/38* (2013.01);
(Continued)

(58) Field of Classification Search
CPC ........ G01D 5/16; G01D 3/036; G01R 17/105; G01R 33/0029; H03F 3/38; H03F 2200/261; H03M 1/0629
See application file for complete search history.

(56) References Cited

U.S. PATENT DOCUMENTS

| | | | |
|---|---|---|---|
| 5,675,334 A | 10/1997 | Mccartney | |
| 2005/0162210 A1* | 7/2005 | Tanzawa | G06G 7/14 |
| | | | 327/352 |

(Continued)

OTHER PUBLICATIONS

Extended European Search Report and Search Opinion, Application No. EP 22212170.9, mailed May 22, 2023, 10 pages.
(Continued)

*Primary Examiner* — Alvaro E Fortich
(74) *Attorney, Agent, or Firm* — McDonnell Boehnen Hulbert & Berghoff LLP

(57) ABSTRACT

Example embodiments relate to sensor readout systems and sensor readout methods. One example sensor readout system includes a signal generator configured to generate a biasing signal. The sensor readout system also includes a first chopper configured to modulate the biasing signal using a chopping signal with a chopping frequency $f_{chop}$ to generate a modulated biasing signal. Additionally, the sensor readout system includes a Wheatstone bridge circuit that includes resistive branches. At least one of the resistive branches includes an impedance-based sensor. The Wheatstone bridge circuit is configured to receive the modulated biasing signal and to generate a sensing signal based on the modulated biasing signal. Further, the sensor readout system includes a second chopper configured to modulate the sensing signal using the chopping signal with the chopping frequency $f_{chop}$ to generate a modulated sensing signal.

20 Claims, 7 Drawing Sheets

100

(51) Int. Cl.
 *G01R 33/00*  (2006.01)
 *H03F 3/38*  (2006.01)
 *H03M 1/06*  (2006.01)
(52) U.S. Cl.
 CPC ..... *H03M 1/0629* (2013.01); *H03F 2200/261*
              (2013.01)

(56) References Cited

U.S. PATENT DOCUMENTS

| | | | | |
|---|---|---|---|---|
| 2016/0065133 | A1* | 3/2016 | Cong | H03F 3/4565 |
| | | | | 600/300 |
| 2016/0242645 | A1* | 8/2016 | Muller | A61B 5/369 |
| 2017/0074915 | A1 | 3/2017 | Raman et al. | |
| 2017/0074991 | A1 | 3/2017 | Gibson | |
| 2017/0241807 | A1* | 8/2017 | Hatakeyama | G01D 5/16 |
| 2017/0343594 | A1* | 11/2017 | Raman | G01R 31/003 |
| 2019/0068146 | A1* | 2/2019 | Raman | H03F 3/45753 |
| 2022/0263519 | A1* | 8/2022 | Melanson | H03M 3/414 |
| 2022/0296142 | A1* | 9/2022 | Wang | A61B 5/0031 |

OTHER PUBLICATIONS

Pun, Alan, Jeff Wong, Gigi Chan, William Wong, David Kwong, and K. C. Wang. "A 0.3 mm$^2$ 60μW 11.2b ENOB signal acquisition ASIC for resistive bridge sensors." In 2013 IEEE International Symposium on Circuits and Systems (ISCAS), pp. 1500-1503. IEEE, 2013.

Ha, Hyunsoo, Yunjae Suh, Seon-Kyoo Lee, Hong-June Park, and Jae-Yoon Sim. "A 0.5 V, 11.3-μW, 1-kS/s Resistive Sensor Interface Circuit with Correlated Double Sampling." In Proceedings of the IEEE 2012 Custom Integrated Circuits Conference, pp. 1-4. IEEE, 2012.

Raman, Johan, and Pieter Rombouts. "A Current-Mode Floating-Bridge Technique for Closed-Loop ΣΔ A Readout of Wheatstone Bridge Sensors." In 2019 IEEE International Symposium on Circuits and Systems (ISCAS), pp. 1-5. IEEE, 2019.

Achille Donida and Diego Barrettino. "A Low-Power Interface Circuit for Piezoresistive Transducers." In 2015 IEEE International Instrumentation and Measurement Technology Conference (12MTC) Proceedings, pp. 1774-1778. IEEE, 2015.

Donald A. Kerth and Douglas S. Piasecki. "An Oversampling Converter for Strain Gauge Transducers." IEEE journal of solid-state circuits 27, No. 12 (1992): 1689-1696.

* cited by examiner

101

R1

303

From CH1

R2

To CH2

302

301

R3          R4

304

306

Rref   Rs1   Rs2   Rs3

305

303

From CH1

R1

To CH2

302

301

R3          R2

304

N = 1

N = 2

N = 2

N = 4

700

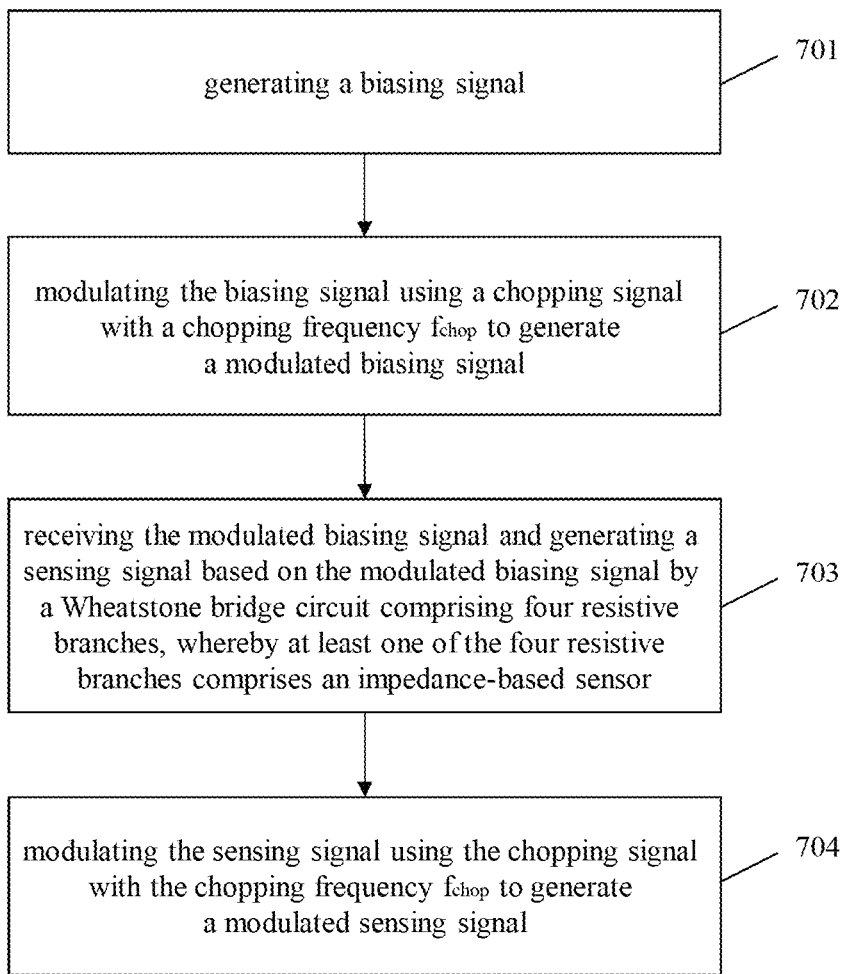

701 — generating a biasing signal

702 — modulating the biasing signal using a chopping signal with a chopping frequency f_chop to generate a modulated biasing signal 703 — receiving the modulated biasing signal and generating a sensing signal based on the modulated biasing signal by a Wheatstone bridge circuit comprising four resistive branches, whereby at least one of the four resistive branches comprises an impedance-based sensor 704 — modulating the sensing signal using the chopping signal with the chopping frequency f_chop to generate a modulated sensing signal

FIG. 7

SENSOR READOUT SYSTEM AND SENSOR READOUT METHOD

CROSS-REFERENCE TO RELATED APPLICATIONS

The present application is a non-provisional patent application claiming priority to European Patent Application No. EP 22212170.9, filed Dec. 8, 2022, the contents of which are hereby incorporated by reference.

FIELD OF THE DISCLOSURE

The present disclosure relates to sensor readout channels, especially to Wheatstone bridge based sensor readout channels for reading out impedance sensors.

BACKGROUND

Generally, Wheatstone bridges are widely used to read out impedance sensors that may monitor physical parameters such as temperature, pressure, humidity, etc., and of which their output may be digitized by readout channels. Such a readout channel may comprise an instrumentation amplifier (IA) to amplify the weak sensor signal and an analog-to-digital converter (ADC) for domain conversion.

For example, the document J. Raman and P. Rombouts, "A current-mode floating-bridge technique for closed-loop $\Sigma\Delta$ readout of Wheatstone bridge sensors," in 2019 IEEE INTERNATIONAL SYMPOSIUM ON CIRCUITS AND SYSTEMS (ISCAS), Sapporo, Japan, 2019 discloses a readout technique for reading out of Wheatstone bridge sensors. However, the effect of the noise in the biasing signal to the Wheatstone bridge is not addressed therein.

Furthermore, in a conventional readout channel, a chopper-based stabilization of the IA may be performed to reduce the input direct current (DC) offset and low-frequency input noise that may degrade the performance of precision DC IAs. In this regard, the sensor signal may be first multiplied by a chopping signal, then may be amplified and may be multiplied again by a similar switching function, and finally may be low-pass filtered.

As a result, the first multiplication may translate the sensor signal spectrum into the high-frequency (HF) region and the second multiplication may recover the amplified original signal by demodulating the signal back to the baseband. On the other hand, the input-referred amplifier DC offset and low-frequency noise components may only go through the second multiplication process, and thus the DC offset may be converted into an HF component at the output and may be fully attenuated by the low-pass filter (LPF).

However, the LPF may include a low cut-off frequency and therefore may include an appreciable silicon area. Furthermore, for a high-precision channel containing a low-noise IA and an analog-to-digital converter (ADC), the above-mentioned chopper stabilization can be implemented in the channel for both the IA and the ADC.

In this regard, after the de-modulation of the IA, a bulky LPF may be used, especially before the signal can be sampled by the ADC. Moreover, due to the presence of the LPF, a buffer or a programmable gain amplifier (PGA) may be used in front of the ADC, which may add additional power consumption to the channel.

SUMMARY

Accordingly, the present disclosure facilitates Wheatstone bridge based sensor readout channels that are robust to the channel generated noise, and to stabilize the IA in the sensing channel to allow a more relaxed low-pass filtration (i.e., size constrain) and further to reduce the overall power consumption, and moreover to improve the gain accuracy of the filtered signal.

The features of the first independent claim for the sensor readout system and by the features of the second independent claim for the sensor readout method provide for the above. The dependent claims contain further developments.

According to a first aspect of the present disclosure, a sensor readout system is provided. The sensor readout system comprises a signal generator configured to generate a biasing signal, a first chopper configured to modulate the biasing signal using a chopping signal with a chopping frequency $f_{chop}$ to generate a modulated biasing signal, a Wheatstone bridge circuit comprising resistive branches, at least one of the resistive branches comprises an impedance-based sensor, the Wheatstone bridge circuit being configured to receive the modulated biasing signal and to generate a sensing signal based on the modulated biasing signal, and a second chopper configured to modulate the sensing signal using the chopping signal with the chopping frequency $f_{chop}$ to generate a modulated sensing signal.

In some embodiments, the sensor readout system further comprises an amplifier configured to amplify the modulated sensing signal to generate an amplified signal, a low-pass filter configured to filter the amplified signal with a cutoff frequency of at least $3\times f_{chop}$ (e.g., a cutoff frequency of $3.5\times f_{chop}$) to generate a filtered signal, an analog-to-digital converter configured to sub-sample the filtered signal with a sampling frequency of $N\times2\times f_{chop}$, where N is an integer, and a correlated double sampling block configured to perform correlated double sampling operation by subtracting the samples at the chopping frequency $f_{chop}$.

Alternatively, the low-pass filter may be configured to filter the amplified signal with a cutoff frequency lower than $3\times f_{chop}$, for example, a cutoff frequency of $2.5\times f_{chop}$, to generate the filtered signal.

In this regard, the correlated double sampling operation may correspond to a discrete time signal processing technique that may receive or select two samples, especially two opposite or phase-shifted samples, after the sub-sampling operation and may subtract the samples. The subtraction may eliminate the input-referred amplifier DC offset and/or low-frequency noise components, while the useful signal component may be doubled in amplitude.

Therefore, the first modulation at the first chopper may up-convert any noise components within or associated with the biasing signal to the chopping frequency. The chopping signal may be generated and provided by a chopping signal generator, which may generate a square wave of frequency $f_{chop}$ as the chopping signal. The second modulation at the second chopper may up-convert the sensor signal from the Wheatstone bridge circuit to the chopping frequency.

Additionally, and at the same time, the second chopper may down-convert the up-converted noise components of the biasing signal to the baseband or DC, whereby input-referred amplifier DC offset and low-frequency noise components may also remain at the baseband or DC. As such, all noise components at the output of the second chopper and/or the amplifier may remain at the baseband or DC, while the useful signal is up-converted to the chopping frequency in the frequency spectrum.

Furthermore, instead of performing a de-modulation with the chopping signal to down-convert the useful signal to the baseband or DC, the de-modulation may be performed by sub-sampling and further by a correlated double sampling by subtracting the samples, especially to facilitate filtering at or around the chopping frequency to extract the useful signal and to eliminate the noise components, e.g., high-pass filtering at or around the chopping frequency to filter out the noise components at the baseband or DC.

In addition, the low-pass filtering of the amplified signal to include one or more harmonics, i.e., the chopping harmonics, may improve the gain accuracy, especially by sub-sampling the chopping harmonics. For instance, at least one higher order chopping harmonic, e.g., one higher order odd harmonic because of the square wave chopping signal, may be filtered along with the up-modulated signal at the chopping frequency which may improve the gain accuracy of the signal and further may decrease the noise components due to sub-sampling of the signals and the noise components.

For example, a low-pass filtering with a cutoff frequency of $3 \times f_{chop}$ may reduce the noise but give a higher gain error, whereas a low-pass filtering with a cutoff frequency of $4 \times f_{chop}$ may give a lower gain error but more noise.

Alternatively, the low-pass filter cutoff frequency may be defined based on the gain accuracy. For example, the low-pass filtering of the amplified signal may not include signal harmonics, i.e., low-pass filtering with a cutoff frequency lower than $3 \times f_{chop}$, which may increase the gain error.

In some embodiments, the operational parameters (e.g., the low cut-off) for the low-pass filtration may be relaxed to facilitate compact filters as well as to eliminate the inclusion of buffers and/or PGAs before the analog-to-digital signal conversion.

In some embodiments, the sensor readout system further comprises a multiplexer configured to select the impedance-based sensor from a plurality of impedance-based sensors and further to couple the impedance-based sensor to the at least one of the resistive branches (e.g., the four resistive branches). In this regard, the multiplexer is further configured to select a reference resistive element having a pre-defined resistance value and further to couple the reference resistive element to the at least one of the four resistive branches.

In some embodiments, at least one of the resistive branches (e.g., the four resistive branches) comprises a variable resistive element. Alternatively, at least two of the resistive branches (e.g., the four resistive branches) may comprise a variable resistive element. Further alternatively, each of the four resistive branches may comprise a variable resistive element.

In some embodiments, the signal generator is configured to generate a biasing current as the biasing signal. Alternatively, the signal generator is configured to generate a biasing voltage as the biasing signal. In this regard, the signal generator comprises or is a proportional to absolute temperature (PTAT) bias generator. Additionally or alternatively, the signal generator may comprise or be a complementary to absolute temperature (CTAT) bias generator. In other embodiments, the signal generator may configure the temperature dependency of the biasing signal.

In some embodiments, the low-pass filter is configured to settle before the sub-sampling of the filtered signal. In some embodiments, the low-pass filter may reduce or eliminate aliasing effects in the filtered signal.

In some embodiments, the correlated double sampling block is further configured to add a gain factor in digital domain after performing the correlated double sampling operation. In some embodiments, for example, the gain accuracy can be further improved.

In addition, the correlated double sampling block may apply sinc filtering and/or zero-order-hold to the samples before and/or after the correlated double sampling operation. For example, the correlated double sampling block may attenuate the samples by a sinc filter and/or by a zero-order hold model based on the sampling frequency of the analog-to-digital converter to reconstruct the original signal.

In some embodiments, the impedance-based sensor is a resistive temperature sensor, a resistive humidity sensor, a resistive pressure sensor, or a piezoresistive sensor.

According to a second aspect of the present disclosure, a sensor readout method is provided. The method comprises the steps of generating a biasing signal, modulating the biasing signal using a chopping signal with a chopping frequency $f_{chop}$ to generate a modulated biasing signal, receiving the modulated biasing signal and generating a sensing signal based on the modulated biasing signal by a Wheatstone bridge circuit comprising resistive branches, whereby at least one of the resistive branches comprises an impedance-based sensor, and modulating the sensing signal using the chopping signal with the chopping frequency $f_{chop}$ to generate a modulated sensing signal.

In some embodiments, the method further comprises the steps of amplifying the modulated sensing signal to generate an amplified signal, low-pass filtering the amplified signal with a cutoff frequency of at least $3 \times f_{chop}$ (e.g., a cutoff frequency of $3.5 \times f_{chop}$) to generate a filtered signal, sub-sampling the filtered signal with a sampling frequency of $N \times 2 \times f_{chop}$, where N is an integer, and performing correlated double sampling operation by subtracting the samples at the chopping frequency $f_{chop}$.

Alternatively, the low-pass filter may be configured to filter the amplified signal with a cutoff frequency lower than $3 \times f_{chop}$, for example, a cutoff frequency of $2.5 \times f_{chop}$, to generate the filtered signal.

In some embodiments, the method further comprises the steps of selecting the impedance-based sensor from a plurality of impedance-based sensors, and coupling the impedance-based sensor to the at least one of the resistive branches (e.g., the four resistive branches).

In some embodiments, the method further comprises the steps of selecting a reference resistive element having a pre-defined resistance value, and coupling the reference resistive element to the at least one of the resistive branches (e.g., the four resistive branches).

In some embodiments, the method further comprises the step of generating a biasing current as the biasing signal. Alternatively, the method further comprises the step of generate a biasing voltage as the biasing signal.

It is to be noted that the method according to the second aspect corresponds to the system according to the first aspect and its implementation forms. Accordingly, the method according to the second aspect achieves the same effects as the system of the first aspect and its respective implementation forms.

BRIEF DESCRIPTION OF THE DRAWINGS

Embodiments of the present disclosure are now further explained with respect to the drawings by way of non-limiting example only.

FIG. 7 shows a method according to the second aspect of the present disclosure, according to example embodiments.

DETAILED DESCRIPTION

Reference will now be made in detail to the embodiments of the present disclosure, examples of which are illustrated in the accompanying drawings. However, the following embodiments of the present disclosure may be variously modified and the range of the present disclosure is not limited by the following embodiments. Reference signs for similar entities in different embodiments are partially omitted.

Figure 1:
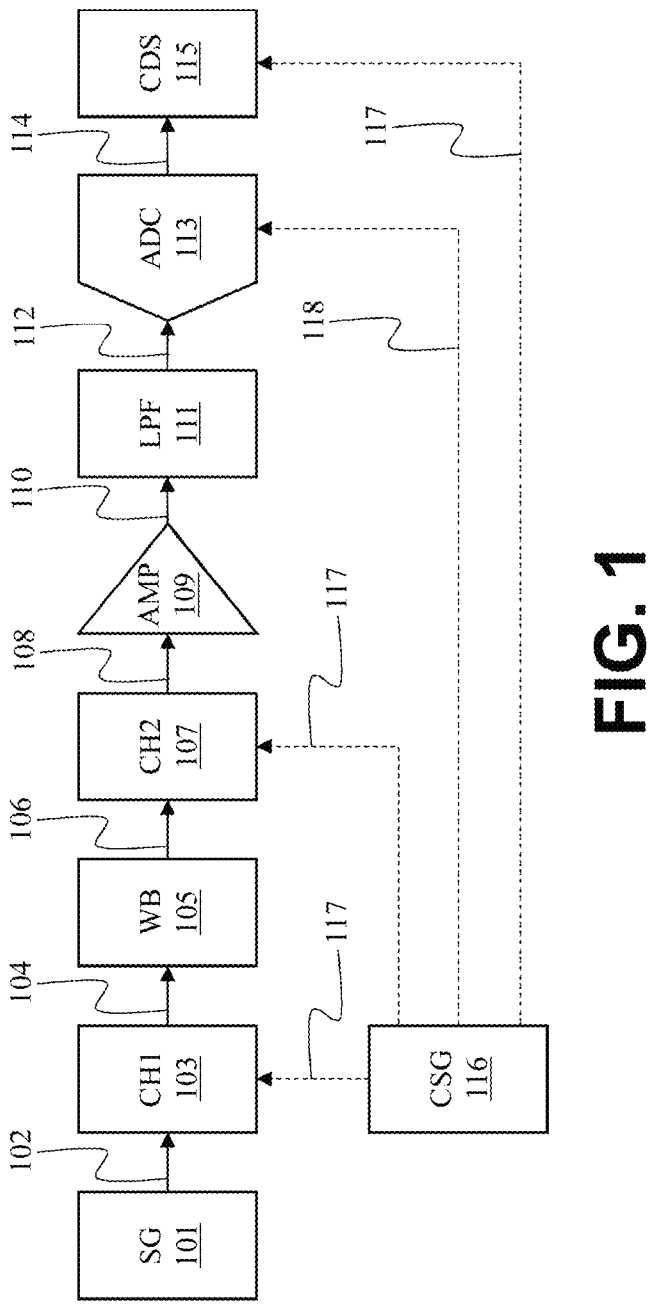
FIG. 1 shows a system according to the first aspect of the present disclosure, according to example embodiments.

In FIG. 1, an example embodiment of the system 100 according to the first aspect of the present disclosure is illustrated. The system 100 may comprise a signal generator (SG) 101 that may generate a biasing signal 102. The signal generator 101 may introduce DC offset and/or low-frequency noise components, hereinafter referred as biasing noise components, in the biasing signal 102. The noise signal introduced by the signal generator 101 may remain at the baseband or at DC in the frequency spectrum.

The system 100 may further comprise a first chopper (CH1) 103 operably coupled to the signal generator 101. The first chopper 103 may receive the biasing signal 102 from the signal generator 101 and may modulate the biasing signal 102 using a chopping signal 117 with a chopping frequency $f_{chop}$ to generate a modulated biasing signal 104.

The system 100 may further comprise a Wheatstone bridge circuit (WB) 105 operably coupled to the first chopper 103. The Wheatstone bridge circuit 105 may comprise one or more impedance-based sensors. In this regard, the Wheatstone bridge circuit 105 may receive the modulated biasing signal 104 from the first chopper 103 for biasing the circuitry and may accordingly generate a sensing signal 106, especially an analog measurement signal, e.g., as a result of the measurements carried out by the one or more impedance-based sensors.

The system 100 may further comprise a second chopper (CH2) 107 operably coupled to the Wheatstone bridge circuit 105. The second chopper 107 may receive the sensing signal 106 from the Wheatstone bridge circuit 105, and may modulate the sensing signal 106 using the chopping signal 117 with the chopping frequency $f_{chop}$ to generate a modulated sensing signal 108.

For the first chopper 103 and the second chopper 107, the term "chopper" should be understood as a multiplier or a modulator that may multiply or mix an input signal with a carrier signal in order to up-modulate or to shift the input signal from the baseband to the frequency of the carrier signal in the frequency spectrum including the generation of corresponding signal harmonics, e.g., due to the modulation with a square wave chopping signal.

The system 100 may further comprise an amplifier (AMP) 109, especially an instrumentation amplifier (IA), operably coupled to the second chopper 107. The amplifier 109 may receive the modulated sensing signal 108 from the second chopper 107, especially at one or more inputs of the amplifier 109, and may amplify the modulated sensing signal 108 to generate an amplified signal 110. The amplifier 109 may be a band-limited amplifier having a bandwidth of about $35 \times f_{chop}$. Alternatively, the amplifier 204 may be designed to have a bandwidth based on the gain accuracy (e.g., a bandwidth lower than $35 \times f_{chop}$ may result in an increased gain error).

In this regard, the amplifier 109 may introduce input-referred amplifier DC offset and low-frequency noise components, hereinafter referred as amplifier noise components, while amplifying the modulated sensing signal 108. The noise signal introduced by the amplifier 109 may remain at the baseband or at DC in the frequency spectrum.

The system 100 may further comprise a low-pass filter (LPF) 111 operably coupled to the amplifier 109. The LPF 111 may receive the amplified signal 110 from the amplifier 109, and may filter the amplified signal 110 to generate a filtered signal 112. The LPF 111 may have a cut-off frequency of about $3.5 \times f_{chop}$. As such, the filtered signal 112 may comprise one or more harmonic components or chopping harmonics in the frequency spectrum resulted from, e.g., the second chopping operation.

For instance, the chopping signal 117 may be a square wave of frequency $f_{chop}$. The first chopping operation at the first chopper 103 may up-modulate the biasing noise components at the chopping frequency $f_{chop}$. Furthermore, the second chopping operation at the second chopper 107 may up-modulate the sensing signal 106 at the chopping frequency $f_{chop}$, while at the same time, may down-modulate the biasing noise components at the baseband or DC in the frequency spectrum.

Hence, the modulated sensing signal 108 generated by the second chopper 107 may comprise the sensing signal 106 at the chopping frequency $f_{chop}$, a first (odd) harmonic component at the frequency $3 \times f_{chop}$, a second (odd) harmonic component at the frequency $5 \times f_{chop}$ and so on in the frequency spectrum. As the LPF 111 may filter the amplified signal 110 with a cut-off frequency of about $3.5 \times f_{chop}$, the filtered signal 112 may comprise the biasing noise components and the amplifier noise components at the baseband, the sensing signal 108 at the chopping frequency $f_{chop}$, and the harmonic component at the frequency $3 \times f_{chop}$.

The system may further comprise an analog-to-digital converter (ADC) 113 operably coupled to the LPF 111. The ADC 113 may receive the filtered signal 112 from the LPF 111, and may perform sub-sampling of the filtered signal 112 to generate discrete samples 114. The ADC 113 may sub-sample the filtered signal 112 with a sampling frequency of $N \times 2 \times f_{chop}$, e.g., with a sampling frequency of $2 \times f_{chop}$ for sampling twice during one chopping period $T_{chop}$.

The system may further comprise a correlated double sampling (CDS) block 115 operably coupled to the ADC 114. The CDS block 115 may operate at the chopping frequency $f_{chop}$, may receive the samples 114 from the ADC 113, and may perform correlated double sampling operation by subtracting the samples 114 at the chopping frequency $f_{chop}$. For example, the ADC 113 may provide two samples corresponding to two opposite signal level instances or successive levels. The CDS block 115 may subtract the samples, which may eliminate or reduce the noise components, however, the useful signal may be doubled in amplitude.

The system may further comprise a chopping signal generator (CSG) 116 operably coupled to the first chopper 103, the second chopper 107, the ADC 113, and the CDS block 115. The chopping signal generator 116 may generate the chopping signal 117 and may provide the chopping signal 117 to the first chopper 103 and to the second chopper 107. The signal generator 116 may further generate the sampling clock 118 for the sub-sampling and may provide the sampling clock 118 to the ADC 113. The signal generator may further provide the chopping signal 117 as the CDS clock to the CDS block 115.

It is to be noted that the coupling between the above-mentioned entities, especially between the entities including the first chopper 103, the Wheatstone bridge circuit 105, the second chopper 107, the amplifier 109, the LPF 111, and the ADC 113, may correspond to a single-ended connection or a differential connection.

Figure 2:
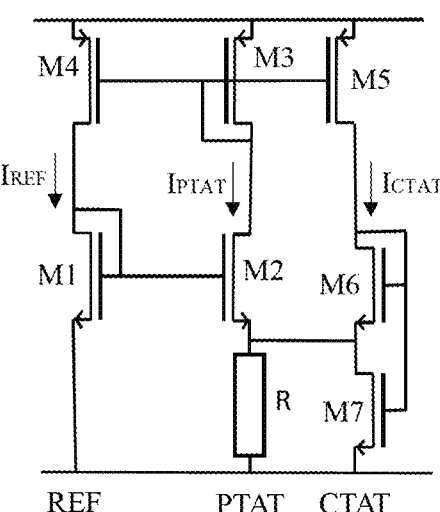
FIG. 2 shows a signal generator, according to example embodiments.

In FIG. 2, an example embodiment of the signal generator 101 is illustrated. The signal generator 101 may correspond to a biasing current signal generator. The signal generator may comprise a reference current branch (REF) corresponding to the reference current $I_{REF}$, a PTAT branch corresponding to the $I_{PTAT}$ current as a mirrored or copied version of the $I_{REF}$, and a CTAT branch corresponding to the $I_{CTAT}$ current as a mirrored or copied version of the $I_{REF}$.

In this regard, the REF branch may comprise a PFET M4 and an NFET M1, the PTAT branch may comprise a PFET M3 and an NFET M2 that may act as current mirrors, and the CTAT branch may comprise a PFET M5 and an NFET M6 that may also act as current mirrors. Additionally, the PTAT branch may comprise a feedback resistor or conductor or element R that may have a positive temperature coefficient. Furthermore, the CTAT branch may comprise a further NFET M7 that may have a negative temperature coefficient.

As such, the opposite temperature coefficients may compensate each other, i.e., if the $I_{PTAT}$ and the $I_{CTAT}$ currents may be set to be roughly equal or may be set in a pre-defined ratio, e.g., a ratio of 10 to 1, at some nominal temperature, the resultant current of the $I_{PTAT}$ and the $I_{CTAT}$ currents may become almost temperature independent. Alternatively, the $I_{PTAT}$ and the $I_{CTAT}$ currents may be varied in order to achieve a predetermined temperature dependency of the resulting biasing current.

Figures 3A, 3B:
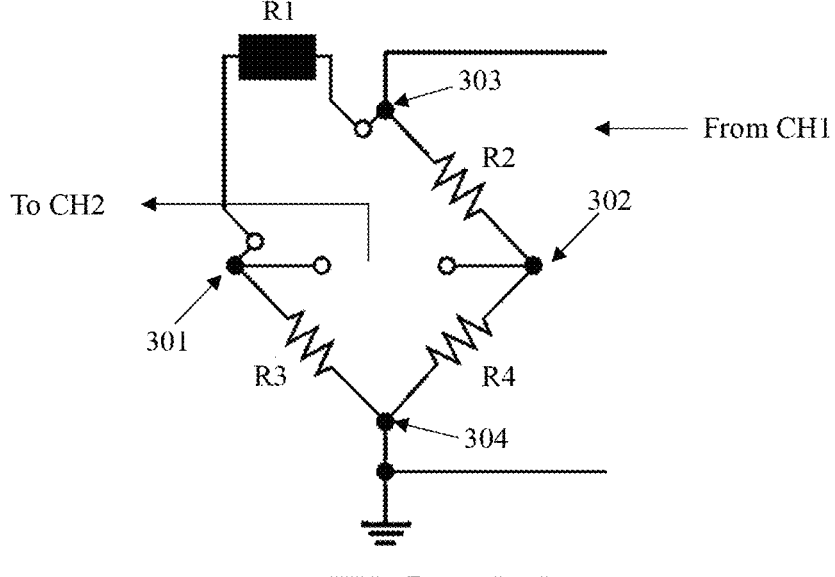
FIG. 3A shows a Wheatstone bridge circuit, according to example embodiments.
FIG. 3B shows a Wheatstone bridge circuit, according to example embodiments.

In FIG. 3A, a first example embodiment of the Wheatstone bridge circuit 105 is illustrated. The Wheatstone bridge circuit 105 may comprise a first resistive branch or resistor R1, a second resistive branch or resistor R2, a third resistive branch or resistor R3, and a fourth resistive branch or resistor R4. In some embodiments, the Wheatstone bridge may have four resistive branches. It might also have another number of branches, such as six or eight branches (e.g., with the same number of branches, such as two, three, or four, on each side).

Furthermore, the branches or the resistors R1, R2, R3, R4 may be arranged such that a first node 301 may be formed between R1 and R3, a second node 302 may be formed between R2 and R4, a third node 303 may be formed between R1 and R2, and a fourth node 304 may be formed between R3 and R4. In this regard, at least one of the resistors R1, R2, R3, R4 may comprise or be an impedance-based sensor or resistive sensor. In this example, R1 is illustrated as the impedance-based sensor. Alternatively, the resistors R1, R2, R3, R4 each may comprise or be the impedance-based sensor.

For instance, the nodes 303 and 304 may be used for biasing the Wheatstone bridge circuit 105, i.e., may be coupled to the first chopper 103, and the nodes 301 and 302 may be used to readout the measurements from the impedance-based sensor or sensors, i.e., may be coupled to the second chopper 107.

Additionally or alternatively, one or more of the resistors R1, R2, R3, R4 may be a variable resistor such that:

$$R2=R+\Delta$$

$$R4=R-\Delta, \text{ and}$$

$$R1=R3=R$$

where R is a constant resistance value in ohm and $\Delta$ is the change in resistance in ohm.

Alternatively, one or more of the resistors R1, R2, R3, R4 may be a variable resistor such that:

$$R2=R+\Delta$$

$$R3=R+\Delta, \text{ and}$$

$$R1=R4=R$$

where R is a constant resistance value in ohm and $\Delta$ is the change in resistance in ohm.

Alternatively, all of the resistors R1, R2, R3, R4 may be a variable resistor such that:

$$R1=R+\Delta$$

$$R2=R-\Delta$$

$$R3=R-\Delta, \text{ and}$$

$$R4=R+\Delta$$

where R is a constant resistance value in ohm and $\Delta$ is the change in resistance in ohm.

In FIG. 3B, a second example embodiment of the Wheatstone bridge circuit 105 is illustrated. The second example embodiment of FIG. 3B differs from the first example embodiment of FIG. 3A in that at least one resistive branch or resistor may be replaced with a multiplexer 305. In this example, R1 is replaced with the multiplexer 305. The multiplexer 305 may be further coupled to one or more impedance-based sensors (e.g., three impedance-based sensors Rs1, Rs2, Rs3), and may be further coupled to a reference resistor or sensor Rref.

The reference resistor Rref may be used to calibrate the Wheatstone bridge circuit 105 and/or to generate reference measurements for calibration of the Wheatstone bridge circuit 105. A control 306 may be provided to the multiplexer 305 in order to select the sensors Rref, Rs1, Rs2, and Rs3 (e.g., to replace R1 of FIG. 3A).

It is to be understood that the multiplexer 305 can be used to replace any of the resistors R1, R2, R3, R4 in order to select the impedance-based resistor and further to modify the readout path within the Wheatstone bridge circuit 105. Additionally or alternatively, more than one resistors R1, R2, R3, R4 can be replaced using the above-described arrangement so that more than one impedance-based sensor can be used.

Figure 4:
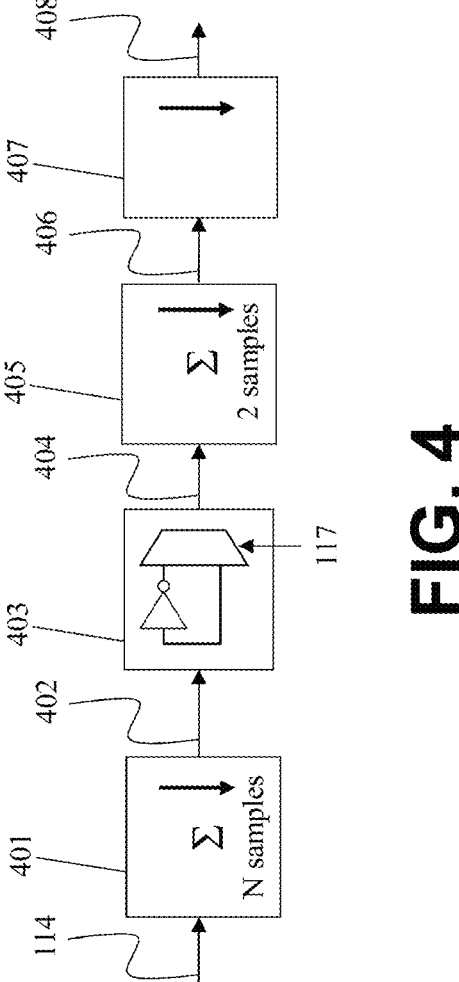
FIG. 4 shows a correlated double sampling block, according to example embodiments.

In FIG. 4, an example embodiment of the CDS block 115 is illustrated. The CDS block 115 may comprise a first decimation block 401 that may receive the ADC samples 114 with a sampling frequency of $N \times 2 \times f_{chop}$ and may decimate or down-sample the samples 114 by N samples, thereby resulting the decimated samples 402 at a sampling frequency of $2 \times f_{chop}$. In this regard, the first decimation block 401 may perform a zero-order hold operation or sinc filtering to attenuate the ADC samples 114.

The CDS block 115 may further comprise a subtraction block 403 operably coupled to the first decimation block 401. The subtraction block 403 may operate at the chopping frequency $f_{chop}$, may receive the decimated samples 402 from the first decimation block 401, and may subtract the samples 402 at the chopping frequency $f_{chop}$ to generate subtracted samples 404.

The CDS block 115 may further comprise a second decimation block 405 operably coupled to the subtraction block 403. The second decimation block 405 may receive the subtracted samples 404 and may decimate or down-sample the samples 404 by 2 samples, thereby resulting the further decimated samples 406 at a sampling frequency of $f_{chop}$. In this regard, the second decimation block 405 may perform a zero-order hold operation or sinc filtering to attenuate the subtracted samples 404.

The CDS block 115 may further comprise a third decimation block 407 operably coupled to the second decimation block 405. The third decimation block 407 may receive the further decimated samples 406 and may decimate or down-sample the samples 406 to generate the output discrete signal 408 at a suitable frequency, e.g., 40 Hz. In this regard, the third decimation block 407 may perform a zero-order hold operation or sinc filtering to attenuate the further decimated samples 406. The CDS block 115 may additionally comprise a gain block (not shown), especially coupled to the third decimation block 407, in order to apply a digital gain at the CDS block output, especially on the output discrete signal 408.

In this regard, the system 100 may omit the LPF 111, and the digital gain provided by the CDS block 115 may be defined to reduce the gain error to improve the gain accuracy. Alternatively, the system 100 may include the LPF 111 and the CDS block 115 may additionally provide the gain in the digital domain at the output of the CDS block 115 to further reduce the gain error, thereby further improving the gain accuracy.

Figure 5:
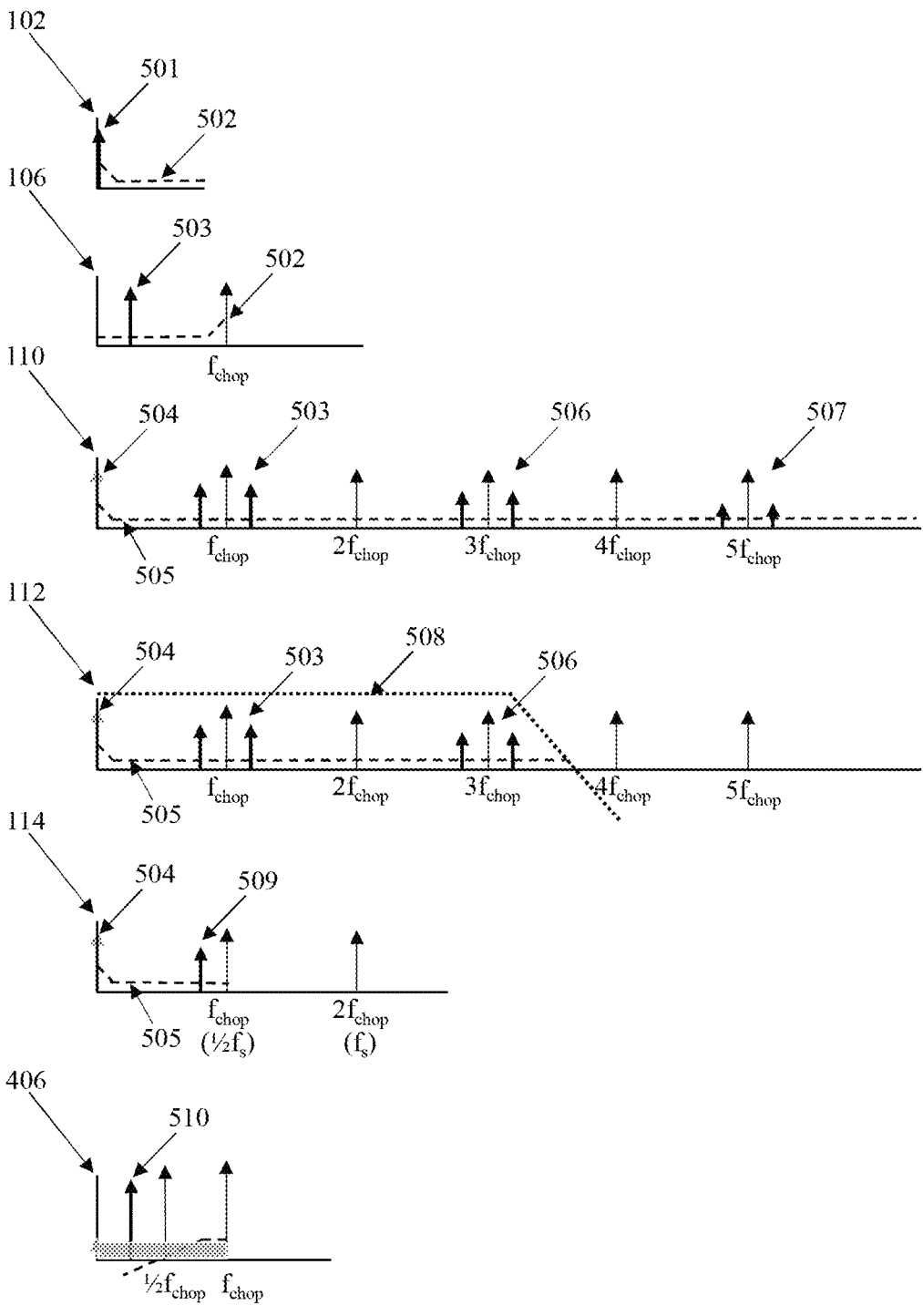
FIG. 5 shows a signal progression for the system in the frequency domain, according to example embodiments.

In FIG. 5, an example signal progression for the system 100, especially in the frequency domain, is illustrated. The signal 102 may correspond to the biasing signal 102 generated by the signal generator 101. The signal 102 comprises the biasing signal 501, e.g. biasing current, and the biasing noise components 502 at the baseband.

The signal 106 may correspond to the first chopper output 104 or the Wheatstone bridge circuit output 106. The signal 106 comprises the sensing signal 503 at the baseband, however, the biasing noise components 502 are up-modulated to the chopping frequency $f_{chop}$ due to the first chopping operation at the first chopper 103.

The signal 110 may correspond to the second chopper output 108 or the amplifier output 110. The noise components 504 and 505 correspond to the combination of the amplifier noise components and the biasing noise components. Since the second chopping operation is performed before the amplification operation, the up-modulated biasing noise components 502 are down-modulated to the baseband, however, the amplifier noise components are not affected by any modulation, and therefore remain at the baseband.

Furthermore, the original baseband frequency components of the sensing signal 503 are modulated and are shown at the odd harmonics, e.g., the frequency component 503 at $f_{chop}$, the frequency component 506 at $3\times f_{chop}$, the frequency component 507 at $5\times f_{chop}$, and so on.

The signal 112 may correspond to the filter output, i.e., the ADC input 112, where the LPF 111 applies a cut-off frequency of $3.5\times f_{chop}$, as shown by the filter band 508, especially to include the noise components 504, 505 at the baseband, the frequency component 503 at $f_{chop}$, and the frequency component 506 at $3\times f_{chop}$.

For example, the second chopper 107 may up-modulate the sensing signal 106 $A*\cos(\omega_{in}t)$, where A is the signal

10 amplitude and $\omega_{in}$ is the signal frequency, e.g., with a square wave of +1 and −1. The Fourier expansion of the chopping signal 117 can be expressed as:

$$\frac{4}{\pi}\left\{\sin(\omega_{chop}t) + \frac{1}{3}\sin(3\omega_{chop}t) + \frac{1}{5}\sin(5\omega_{chop}t) + ...\right\}$$

where $\omega_{chop}$ is the chopping frequency.

The first term of the modulated sensing signal 108 can be expressed as:

$$\frac{4}{\pi}*A*\left\{\frac{1}{2}\sin((\omega_{chop}-\omega_{in})t) - \frac{1}{2}\sin((\omega_{chop}+\omega_{in})t)\right\}$$

It can be understood that the amplitude $$\frac{4}{\pi}*A$$

after demodulation is greater than the original amplitude, and therefore, a gain error may arise.

The signal 114 may correspond to the ADC output 114, where the ADC 113 operates at a sampling frequency of $2\times f_{chop}$. Particularly, the ADC 113 sub-samples all signals greater than $f_s/2$, which results in the amplitude A due to the sub-sampling of the frequency component 503 at $f_{chop}$ and the frequency component 506 at $3\times f_{chop}$, as shown by the frequency component 509, thereby reducing the gain error. Furthermore, the ADC 113 sub-samples the noise components, e.g., the noise components at $2\times f_{chop}$ to the baseband. Moreover, in order to eliminate aliasing, the LPF 111 settles before the ADC 113 takes samples.

The signal 406 may correspond to the CDS block output 406 of FIG. 4. The CDS block 115 subtracts the ADC samples at $f_{chop}$ to demodulate the frequency components 509 back to the baseband, as shown by the frequency component 510, especially by providing band-pass filtration at $f_{chop}$. For example, the noise component 504 at the baseband therefore can be eliminated because of the high-pass filtration at or around $f_{chop}$ or $f_s/2$, and the noise component 505 can be eliminated or minimized by sample subtraction. The effective example noise components at the CDS block output 408 are shown by the shaded area in the frequency plot (e.g., the noise component at the base band or DC may correspond to the attenuated DC offset of the amplifier 109).

Figure 6:
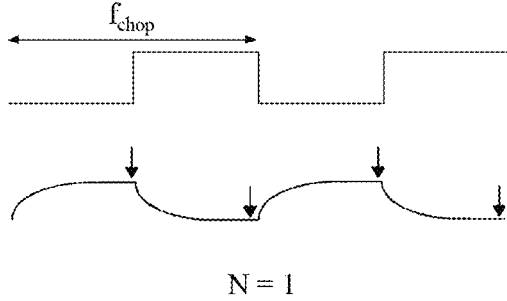
FIG. 6 shows sub-sampling schemes for the analog-to-digital converter, according to example embodiments.
Figure 6:
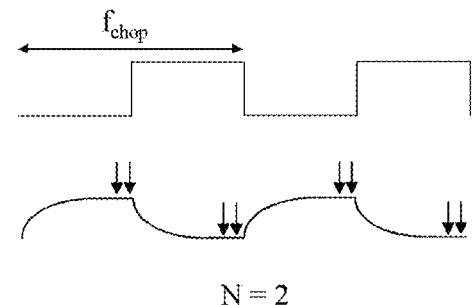
Figure 6:
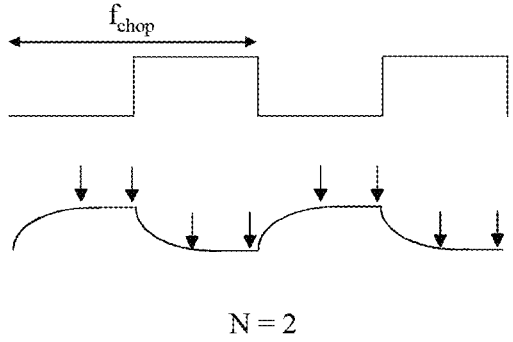
Figure 6:
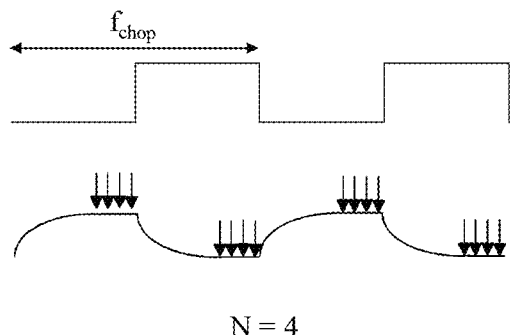

In FIG. 6, example sub-sampling schemes for the ADC 113 are illustrated. For example, the ADC 113 may sub-sample the filtered signal 112 with a sampling frequency of $2\times f_{chop}$, i.e., N=1. In this regard, the ADC 113 may take samples at the edges of the successive signal levels (top left figure). Accordingly, the CDS block 115 may subtract the two successive samples, e.g., with a zero-order hold at a sampling frequency of $f_{chop}$.

As a result of the subtraction and due to the constant level of the noise signal floor, the noise signal can be reduced, while at the same time due to the opposite nature of the actual signal component, the resultant signal may be doubled in amplitude. However, in this example, especially due to the sub-sampling of the noise components because of the band-limited anti-aliasing filtering of the LPF 111, the signal-to-noise ratio (SNR) may remain the same.

Alternatively, the ADC 113 may sub-sample the filtered signal 112 with a sampling frequency of $4 \times f_{chop}$, i.e., N=2. In this regard, the ADC 113 may take samples at the edges of the successive signal levels (top right figure).

Further alternatively, the ADC 113 may sub-sample the filtered signal 112 with a sampling frequency of $4 \times f_{chop}$, i.e., N=2. In this regard, the ADC 113 may take samples at different instances with a defined sampling span on the successive signal levels (bottom left figure).

Further alternatively, the ADC 113 may sub-sample the filtered signal 112 with a sampling frequency of $8 \times f_{chop}$, i.e., N=4. In this regard, the ADC 113 may take samples at the edges of the successive signal levels (bottom right figure) or may take samples at different instances with a defined sampling span on the successive signal levels (not shown).

In FIG. 7, an example embodiment of the method 700 according to the second aspect of the present disclosure is illustrated. In a first step 701, a biasing signal is generated. In a second step 702, the biasing signal is modulated using a chopping signal with a chopping frequency $f_{chop}$ to generate a modulated biasing signal. In a third step 703, the modulated biasing signal is received and a sensing signal is generated based on the modulated biasing signal by a Wheatstone bridge circuit comprising four resistive branches, whereby at least one of the four resistive branches comprises an impedance-based sensor. In a fourth step 704, the sensing signal is modulated using the chopping signal with the chopping frequency $f_{chop}$ to generate a modulated sensing signal.

Moreover, in a further step, the modulated sensing signal is amplified to generate an amplified signal. In a further step, the amplified signal is low-pass filtered with a cutoff frequency of at least $3 \times f_{chop}$ (e.g., a cutoff frequency of $3.5 \times f_{chop}$) to generate a filtered signal. In a further step, the filtered signal is sub-sampled with a sampling frequency of $N \times 2 \times f_{chop}$, where N is an integer. In a further step, a correlated double sampling operation is performed by subtracting the samples at the chopping frequency $f_{chop}$.

It is important to note that, in the claims as well as in the description, the word "comprising" does not exclude other elements or steps and the indefinite article "a" or "an" does not exclude a plurality. A single element or other unit may fulfill the functions of several entities or items recited in the claims. Furthermore, the word "coupled" implies that the elements may be directly connected together or may be coupled through one or more intervening elements. Moreover, the description with regard to any of the aspects is also relevant with regard to the other aspects of the present disclosure.

Although the present disclosure has been illustrated and described with respect to one or more implementations, equivalent alterations and modifications will occur to others skilled in the art upon the reading and understanding of this specification and the annexed drawings. In addition, while a particular feature of the present disclosure may have been disclosed with respect to only one of several implementations, such feature may be combined with one or more other features of the other implementations as may be desired for any given or particular application.

What is claimed is:

1. A sensor readout system comprising:
a signal generator configured to generate a biasing signal;
a first chopper configured to up-modulate or down-modulate the biasing signal using a chopping signal with a chopping frequency $f_{chop}$ to generate a modulated biasing signal;

a Wheatstone bridge circuit comprising resistive branches, wherein at least one of the resistive branches comprises an impedance-based sensor, and wherein the Wheatstone bridge circuit is configured to receive the modulated biasing signal and to generate a sensing signal based on the modulated biasing signal; and
a second chopper configured to up-modulate or down-modulate the sensing signal using the chopping signal with the chopping frequency $f_{chop}$ to generate a modulated sensing signal.

2. The sensor readout system according to claim 1, further comprising:
an amplifier configured to amplify the modulated sensing signal to generate an amplified signal;
a low-pass filter configured to filter the amplified signal with a cutoff frequency of at least $3 \times f_{chop}$ to generate a filtered signal;
an analog-to-digital converter configured to sub-sample the filtered signal with a sampling frequency of $N \times 2 \times f_{chop}$, where N is an integer; and
a correlated double sampling block configured to perform a correlated double sampling operation by subtracting samples at the chopping frequency $f_{chop}$.

3. The sensor readout system according to claim 2, wherein the cutoff frequency is at least $3.5 \times f_{chop}$.

4. The sensor readout system according to claim 2, wherein the low-pass filter is further configured to settle before the sub-sampling of the filtered signal.

5. The sensor readout system according to claim 2, wherein the correlated double sampling block is further configured to add a gain factor in a digital domain after performing the correlated double sampling operation.

6. The sensor readout system according to claim 1, further comprising a multiplexer configured to:
select the impedance-based sensor from a plurality of impedance-based sensors; and
couple the selected impedance-based sensor to the at least one resistive branch.

7. The sensor readout system according to claim 6, wherein the Wheatstone bridge circuit comprises four resistive branches.

8. The sensor readout system according to claim 6, wherein the multiplexer is further configured to:
select a reference resistive element having a pre-defined resistance value; and
couple the selected reference resistive element to the at least one resistive branch.

9. The sensor readout system according to claim 1, wherein at least one of the resistive branches comprises a variable resistive element.

10. The sensor readout system according to claim 1, wherein the signal generator is configured to:
generate a biasing current as the biasing signal; or
generate a biasing voltage as the biasing signal.

11. The sensor readout system according to claim 1, wherein the signal generator comprises or is a proportional to absolute temperature bias generator.

12. The sensor readout system according to claim 1, wherein the impedance-based sensor is a resistive temperature sensor, a resistive humidity sensor, a resistive pressure sensor, or a piezoresistive sensor.

13. A sensor readout method comprising:
generating a biasing signal;
up-modulating or down-modulating the biasing signal using a chopping signal with a chopping frequency $f_{chop}$ to generate a modulated biasing signal;

receiving, by a Wheatstone bridge circuit comprising resistive branches, the modulated biasing signal, wherein at least one of the resistive branches comprises an impedance-based sensor;

generating, by the Wheatstone bridge circuit, a sensing signal based on the modulated biasing signal; and up-modulating or down-modulating the sensing signal using the chopping signal with the chopping frequency $f_{chop}$ to generate a modulated sensing signal.

14. The method according to claim 13, further comprising:

amplifying the modulated sensing signal to generate an amplified signal;

low-pass filtering the amplified signal with a cutoff frequency of at least $3 \times f_{chop}$ to generate a filtered signal;

sub-sampling the filtered signal with a sampling frequency of $N \times 2 \times f_{chop}$, where N is an integer; and performing a correlated double sampling operation by subtracting samples at the chopping frequency $f_{chop}$.

15. The method according to claim 14, wherein the cutoff frequency is at least $3.5 \times f_{chop}$.

16. The method according to claim 13, further comprising:

selecting the impedance-based sensor from a plurality of impedance-based sensors; and coupling the selected impedance-based sensor to the at least one resistive branch.

17. The method according to claim 16, wherein the Wheatstone bridge circuit comprises four resistive branches.

18. The method according to claim 13, further comprising:

selecting a reference resistive element having a predefined resistance value; and coupling the selected reference resistive element to the at least one resistive branch.

19. The method according to claim 13, further comprising:

generating a biasing current as the biasing signal; or generate a biasing voltage as the biasing signal.

20. A system comprising:

a first chopper configured to up-modulate or down-modulate a biasing signal generated by a signal generator using a chopping signal with a chopping frequency $f_{chop}$ to generate a modulated biasing signal;

a Wheatstone bridge circuit comprising resistive branches, wherein at least one of the resistive branches comprises an impedance-based sensor, and wherein the Wheatstone bridge circuit is configured to receive the modulated biasing signal and to generate a sensing signal based on the modulated biasing signal; and a second chopper configured to up-modulate or down-modulate the sensing signal using the chopping signal with the chopping frequency $f_{chop}$ to generate a modulated sensing signal.

\* \* \* \* \*